US009391232B1

(12) United States Patent
Le et al.

(10) Patent No.: US 9,391,232 B1
(45) Date of Patent: Jul. 12, 2016

(54) VARIABLE COMPOSITION TRANSPARENT CONDUCTIVE OXIDE LAYER AND METHODS OF FORMING THEREOF

(71) Applicant: Intermolecular, Inc., San Jose, CA (US)

(72) Inventors: Minh Huu Le, San Jose, CA (US); Jianhua Hu, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/577,967

(22) Filed: Dec. 19, 2014

(51) Int. Cl.
*H01L 33/42* (2010.01)
*H01L 33/00* (2010.01)
*H01L 33/38* (2010.01)

(52) U.S. Cl.
CPC .............. *H01L 33/005* (2013.01); *H01L 33/38* (2013.01); *H01L 33/42* (2013.01); *H01L 2933/0016* (2013.01); *H01L 2933/0033* (2013.01); *H01L 2933/0058* (2013.01); *H01L 2933/0066* (2013.01); *H01L 2933/0091* (2013.01)

(58) Field of Classification Search
CPC .............. C23C 14/18–14/088; H01L 31/1884; H01L 31/1888; H01L 33/00–33/648
See application file for complete search history.

(56) References Cited

U.S. PATENT DOCUMENTS

| | | | | |
|---|---|---|---|---|
| 7,483,212 B2 * | 1/2009 | Cho | ........................ | G02B 1/113 359/582 |
| 7,821,026 B2 | 10/2010 | Yu et al. | | |
| 8,501,513 B2 * | 8/2013 | Ahlstedt | ......... | H01L 31/022466 257/749 |
| 9,331,250 B1 * | 5/2016 | Wuu | ........................ | H01L 33/44 |
| 2010/0148199 A1 * | 6/2010 | Kim | ........................ | H01L 33/44 257/98 |
| 2010/0311228 A1 * | 12/2010 | Komin | .................. | C23C 14/086 438/478 |
| 2011/0088763 A1 * | 4/2011 | Le | ...................... | H01L 31/03762 136/255 |
| 2011/0226320 A1 * | 9/2011 | Little | .............. | H01L 31/022466 136/256 |
| 2013/0109126 A1 | 5/2013 | Van Duren et al. | | |
| 2015/0187574 A1 * | 7/2015 | Le | ...................... | H01L 21/02631 438/104 |

OTHER PUBLICATIONS

Gorrie; Transparent Conducting Contacts Based on Zinc Oxide Substitutionally Doped with Gallium; May 11-16, 2008; National Renewable Energy Laboratory; 33rd IEEE Photovoltaic Specialists Conference; 7 pages.

* cited by examiner

*Primary Examiner* — Eric Ward

(57) ABSTRACT

Provided are light emitting diodes (LEDs) and methods of fabricating such LEDs. An LED may include a transparent conductive oxide (TCO) layer having a varying refractive index. For example, the refractive index may be higher at the interface of the TCO layer with an epitaxial stack than on the side of the TCO layer. The refractive index variability allows reducing light intensity losses in the LED. The refractive index variability may be achieved by feeding a substrate through a deposition chamber having a variable concentration of at least one process gas, such as oxygen. Specifically, the concentration of the process gas may be higher at one slit opening than at another slit opening. As the substrate moves through the deposition chamber, the TCO layer is continuously deposited. Due to the concentration variability, the resulting TCO layer may have a variable composition throughout the thickness of the TCO layer.

21 Claims, 4 Drawing Sheets

VARIABLE COMPOSITION TRANSPARENT CONDUCTIVE OXIDE LAYER AND METHODS OF FORMING THEREOF

BACKGROUND

A light-emitting diode (LED) is a two-lead semiconductor light source. A typical LED has a structure similar to that of a p-n junction diode. However, the LED also emits light when activated or, more specifically, when a voltage is applied to the leads of the LED. The voltage causes electrons to recombine with electron holes within the LED releasing energy in the form of photons. This release of energy is sometimes referred to as electroluminescence. The color or, more specifically, the wavelength of the emitted light is based on the energy band gap of the semiconductor used for constructing the LED. Modern LEDs are characterized by low power consumption, low heat generation, long operational life, shockproof, small volume, quick response, and other like properties. As a result, LEDs have been widely adopted for various applications, such as light sources in displays. New designs of LEDs with further improvements of above recited characteristics and methods of fabricating such advanced LEDs are needed.

SUMMARY

Provided are LEDs and methods of fabricating such LEDs. An LED may include a transparent conductive oxide (TCO) layer having a varying refractive index and, in some embodiments, variable resistance throughout the thickness of the TCO layer. For example, the refractive index may be higher on one side of the TCO layer (e.g., at the interface of with an epitaxial stack) than on the side. The variability of the refractive index may be used to reduce Fresnel losses within the LED, in particularly transitioning from the epitaxial stack to another material disposed above the TCO layer, such an encapsulation layer or an air gap above the TCO layer. For example, an epitaxial stack may have a refractive index of about 2.3, while the encapsulation layer may have a refractive index of 1.5, when, for example, the encapsulation layer is formed from silicon dioxide or a polymer material.

The refractive index variability may be achieved by varying composition of the TCO layer from one side, e.g., the side interfacing with the epitaxial stack, to the other side, e.g., the side interfacing with the encapsulation layer or air gap. The variable composition TCO layer may be formed by feeding a substrate through a deposition chamber having a variable concentration of at least one process gas, such as oxygen or nitrogen. This process gas may be flown at the one entry point (but, for example, not at the other entry point) to the deposition chamber and may be consumed within the chamber leading to the concentration gradient within the chamber between the two entry points. Specifically, the concentration of the process gas may be higher at one slit opening of the deposition chamber than at another slit opening. It should be noted that the deposition chamber is a part of an inline deposition system that feeds substrate through the deposition system at, for example, a constant speed. It should be also noted that the methods described herein are generally not applicable to batch systems in which substrate resides within a deposition chamber during deposition process rather than being fed through the chamber.

For example, the concentration of oxygen may be higher at the incoming slit, i.e., where the substrate enters the deposition chamber, than at the outgoing slit, i.e., where the substrate leaves the deposition chamber with the TCO layer formed on the substrate. As the substrate moves through the deposition chamber, the TCO layer is being continuously deposited by, for example, sputtering a target disposed over the substrate. The substrate travels through the deposition chamber environment, which has a variable composition.

Due to the concentration variability from one slit to another, the resulting TCO layer has a variable composition throughout the thickness of the TCO layer, i.e., one side to the other or, more specifically, from the bottom side to the top side of the TCO layer. Returning to the example, in which the incoming slit has a higher oxygen concentration than the outgoing slit, the initially deposited portion of the TCO layer will have a higher concentration of oxygen than the later deposited portion of the TCO layer. Concentration profiling may be achieved for other components, such as nitrogen, in a similar manner, e.g., being higher on one side than the other or, more specifically, being higher at the bottom of deposited layer than the top. Without being restricted to any particular theory, it is believed that a TCO material having a higher oxygen concentration has a higher refractive index than a similar TCO material with a lower concentration of oxygen. Furthermore, a TCO material having a higher nitrogen concentration may or may not have a higher refractive index than a similar TCO material with a lower concentration of nitrogen. However, a TCO material having a higher nitrogen concentration is less resistive (to electrical currents) than a similar TCO material with a lower concentration of nitrogen. This resistivity feature may be used to form a low resistance ohmic contact between a TCO layer and an epitaxial stack. Furthermore, a TCO material having a higher nitrogen concentration has better adhesion to nitrogen containing materials of an epitaxial stack than a similar TCO material with a lower concentration of nitrogen. It should be noted that composition of multiple materials, such as oxygen and nitrogen may be varied at the same time. However, concentrations of multiple materials in the same TCO layer do not need to have the same concentration profiles. For example, the concentration of one material may increase from the first side to the second side or, more specifically, from the bottom side to the top side of the TCO layer, while the concentration of another material may decrease from in the same direction.

Provided is a method of fabricating an LED. The method involves feeding a substrate through a deposition chamber from a first slit opening to a second slit opening. The first opening slit may be referred to as incoming slit, while the second slit may be referred to as an outgoing slit. The concentration of at least one process gas is different at the first slit opening than at the second slit opening. For example, the concentration of oxygen and/or nitrogen may be higher at the first slit opening than at the second slit opening. A layer of a TCO material is deposited on the substrate as the substrate is fed through the deposition chamber. As a result of varying concentration of at least one processing gas throughout the chamber, the composition of the TCO layer varies throughout a thickness of this layer. For example, an initial deposited portion of the TCO layer has a higher concentration of oxygen and/or nitrogen that the later deposited portion. This compositional variation results in the refractive index of the TCO layer varying throughout the thickness of the TCO layer. It should be noted that while the description mainly focuses on having a higher concentration of oxygen and/or nitrogen at the side of the TCO layer that is deposited first, one having ordinary skills in the art would understand that embodiments in which the later formed side of the TCO layer has a higher concentration of oxygen and/or nitrogen is also within the scope. For example, a TCO layer may be formed before forming an epitaxial stack. In this case, the side receiving the epitaxial stack, is a later-formed side, and it may have a higher concentration of oxygen and/or nitrogen.

In some embodiments, the refractive index of the TCO layer is greater at the first side of the TCO layer facing the substrate than at the second side of the TCO layer, which faces away from the substrate. For example, the refractive index of the TCO layer at the first side may between about 2.1 and 2.3 or, more specifically, between about 2.2 and 2.3. The refractive index of the TCO at the second side may be between about 1.5 and 1.8 or, more specifically, between about 1.5 and 1.6. The refractive index of the TCO at the second side may depend on the refractive index of a component that interfaces this side. For example, if a silicon dioxide encapsulating layer is later positioned over the TCO layer, then the refractive index values listed above can be used. Alternatively, if the second side faces an air gap in a final device, then the refractive index of the TCO at the second side may be between about 1.0 and 1.3 or, more specifically, between about 1.0 and 1.1.

The variability of the refractive index may be achieved by varying concentration of one or more components in the TCO layer, which in turn depends on the concentration profile of the process gases within the deposition chamber as the substrate is fed through the deposition chamber. In some embodiments, the concentration of oxygen varies throughout the thickness of the TCO layer. For example, the concentration of oxygen may be greater at the first side of the TCO layer facing the substrate than at the second side of the TCO layer facing away from the substrate. The concentration of oxygen may gradually increase from the first side to the second side of the TCO layer. The increase may be linear or not. In some embodiments, the TCO layer has a variable concentration of nitrogen throughout the thickness of the TCO layer.

The TCO layer may include one of indium tin oxide, indium zinc oxide, indium gallium zinc oxide, cadmium tin oxide, zinc oxide, indium oxide, tin oxide, copper aluminum oxide, aluminum gallium oxide, aluminum strontium oxide, or aluminum zinc oxide. Specifically, the TCO may include indium gallium zinc oxide. Oxygen and/or nitrogen concentrations may be varied in TCO layers including any one of these materials.

A TCO layer may be deposited using reactive sputtering. A sputtering target including one or more metals of various materials listed above may be positioned inside a deposition chamber between the first slit opening and the second slit opening. In some embodiments, the sputtering target also includes oxygen (e.g., as a part of metal oxide) and/or nitrogen (e.g., as a part of metal nitride). In some embodiments, the sputtering target includes a metal oxynitride. Alternatively, the sputtering target may metals in their zero valence state (e.g., pure metal or metal alloy). In other words, the target may be free from oxygen and/or nitrogen. In this case, nitrogen and/or oxygen may be added using sputtering, e.g., from the processing environment.

In some embodiments, the TCO layer is deposited over an epitaxial stack. The epitaxial stack includes a p-doped semiconductor layer, active layer, and n-doped semiconductor layer. The active layer may be or may include a multi-quantum well formed by gallium nitride.

In some embodiments, the method also comprises forming another layer over the TCO layer, such as an encapsulation layer. The encapsulation layer may include silicon dioxide or some other suitable material. In some embodiments, no other layers are formed over the TCO layer and instead the TCO interfaces with an air gap in the overall assembly.

Also provided is an LED device including a substrate, epitaxial stack disposed on the substrate, and TCO layer disposed on the epitaxial stack such that the epitaxial stack is disposed between the substrate and the TCO layer. In some embodiments, the epitaxial stack interfaces the TCO layer. The epitaxial stack comprises a p-doped semiconductor layer, active layer, and n-doped semiconductor layer. The p-doped semiconductor layer may directly interface the TCO layer. The composition of the TCO layer may vary throughout a thickness of the TCO layer. For example, the concentration of oxygen may be higher at the interface with the epitaxial stack than on the other side. As a result, the refractive index of the TCO layer varies throughout the thickness of the TCO layer. In some embodiments, the refractive index of the TCO layer is greater at the first side of the TCO layer facing the epitaxial stack than at the second side of the TCO layer facing away from the epitaxial stack. The refractive index of the TCO layer at the first side is between about 2.1 and 2.3. The refractive index of the TCO layer at the second side is between about 1.5 and 1.8. The concentration of oxygen may be greater at the first side of the TCO layer than at the second side.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

Figure 1A:
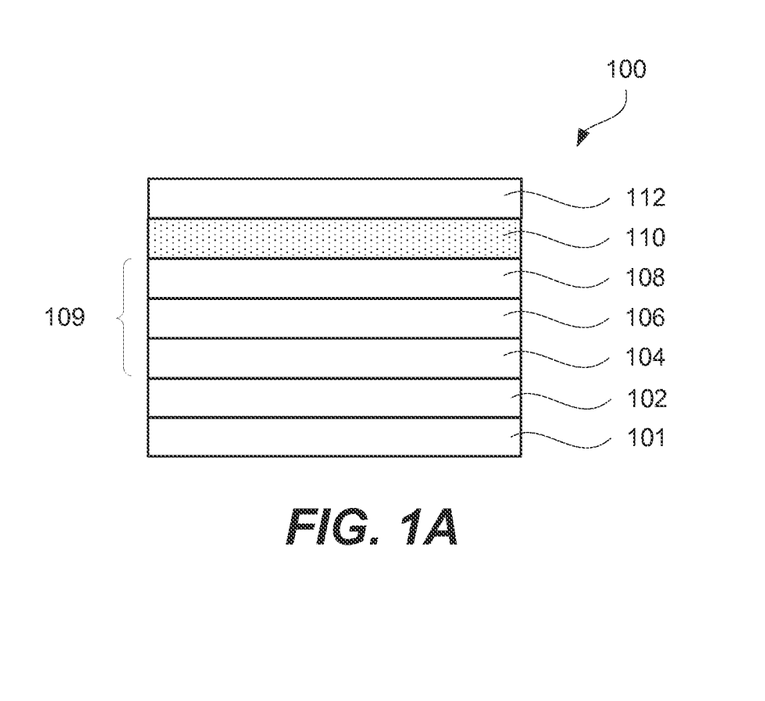
FIG. 1A is a cross-sectional view of an LED having an encapsulating layer above a TCO layer, in accordance with some embodiments.
Figure 1B:
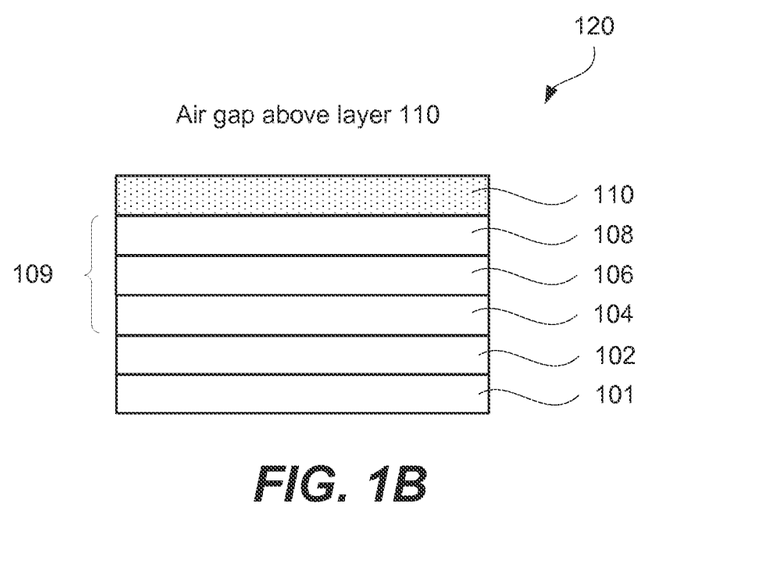
FIG. 1B is a cross-sectional view of an LED having an air gap above a TCO layer, in accordance with some embodiments.

FIGS. 1A and 1B illustrate cross-sectional views of LEDs having TCO layers with changing composition of at least one component. As shown in FIG. 1A, LED 100 may include multiple layers disposed on substrate 102. Some examples of these layers include epitaxial stack 109 grown on substrate 102 and TCO layer 110 deposited on epitaxial stack 109. Substrate 102 may include such materials as sapphire, silicon carbide, silicon, zinc oxide, magnesium oxide, aluminum nitride, gallium nitride, or combinations thereof. Substrate 102 may include other components, such as additional LEDs, electrical leads for supplying electrical power to LED 100, control circuitry, and such.

Epitaxial stack 109 may include n-doped semiconductor 104 disposed over substrate 102 and, in some embodiments, interfacing substrate 102. Epitaxial stack 109 may also include active layer 106 disposed on n-doped semiconductor 104 and p-doped semiconductor 108 disposed over active layer 106. p-doped semiconductor 108 may form a top side of epitaxial stack 109 that receives TCO layer 110. As such, the refractive index of p-doped semiconductor 108 may be determinative of the initial composition of TCO layer 110 and process gas concentration at the incoming slit of the deposition chamber. In some embodiments, p-doped semiconductor 108 includes gallium nitride.

Back electrode 101 may be formed on the side of substrate 102 that is opposite to epitaxial stack 109 if substrate 102 is electrically conductive. LED 100 may further include encapsulating layer 112 deposited over TCO layer 110. Encapsulating layer 112 may directly interface TCO layer 110 and may be formed from silicon oxide.

FIG. 1B shows another example of LED 120. LED 120 is similar to LED 100 described above with reference to FIG. 1A and also includes substrate 102, epitaxial stack 109 disposed over substrate 102, TCO layer 110 disposed over epitaxial stack 109, and back electrode 101 disposed on the side of substrate 102 that is opposite of epitaxial stack 109 if substrate 102 is electrically conductive. However, TCO layer 110 of LED 120 is not covered by an encapsulating layer. Instead, LED 120 has an air gap over its TCO layer 110.

Optical matching, namely refractive index matching, of layers forming an LED helps reducing optical losses within the LED and increase its light output efficiency. A light beam emitted from the epitaxial stack can experience some loss as it travels through each layer disposed above the stack or, more specifically, through interfaces formed by each pair of layers. As described above, these layers may include a TCO layer and, in some embodiments, an encapsulating layer. These losses depend in large part on the refractive index of each layer or, more specifically, on a refractive index difference at each interface formed by different layers. This loss can be referred to as Fresnel loss and can be estimated for normal light incidence for each interface using the following equation:

$$\text{Loss} = ((n_i - n_r)/(n_i + n_r))^2 \quad \text{(Equation 1)}$$

In this equation, $n_i$ and $n_r$ represent refractive indices of two layers forming an interface. As such, a greater difference between refractive indices of two layers forming an interface causes a larger loss. As a general rule, the difference between refractive indices of two interfacing layer should be kept to the minimum. However, because dissimilar materials are used for various components of an LED, achieving refractive index matching, is difficult. It has been found that forming a TCO layer having a variable composition and variable refractive index can help with refractive index matching in particular between the epitaxial stack and encapsulating layer or between the epitaxial stack and air gap as illustrated in FIGS. 1A and 1B.

Referring to FIG. 1A showing LED 100, the light losses may occur, for example, at the interface boundary of TCO layer 110 and encapsulating layer 112 and TCO layer 110 and epitaxial stack 109. As such, refractive indices of TCO layer 110 and encapsulating layer 112 should be as close as possible. Likewise, refractive indices of TCO layer 110 and epitaxial stack 109 should be as close as possible. However, if refractive indices of encapsulating layer 112 and epitaxial stack 109 are quite different, the refractive index matching can be still achieved by varying refractive index of TCO layer 110 between its interfaces with encapsulating layer 112 and epitaxial stack 109 as further described below.

Likewise, referring to FIG. 1B showing LED 120, the light losses may occur, for example, at the interface boundary of TCO layer 110 and air gap and TCO layer 110 and epitaxial stack 109. As such, refractive indices of TCO layer 110 and air gap should be as close as possible. Likewise, refractive indices of TCO layer 110 and epitaxial stack 109 should be as close as possible. However, if refractive indices of air gap and epitaxial stack 109 are quite different, the refractive index matching can be still achieved by varying refractive index of TCO layer 110 between its interfaces with air gap and epitaxial stack 109 as further described below.

Provided is an LED having a TCO layer having a varying refractive index and, in some embodiments, a variable resistance throughout the thickness of the TCO layer. For example, the refractive index may be higher at the interface of the TCO layer with an epitaxial stack than on the side of the TCO layer, such as the side interfacing be encapsulating layer or air gap. The variability of the refractive index may be used to reduce Fresnel losses with an LED as described above. In particular, the losses transitioning from the epitaxial stack, which, in some embodiments, has a refractive index of about 2.3, to either an encapsulation layer or an air gap above the TCO layer may be reduced. For reference, the encapsulation layer may have a refractive index of about 1.5 when, for example, the encapsulation layer is formed from silicon dioxide or a polymer material. The air in the air gap gas has a refractive index of 1.

Figure 2:
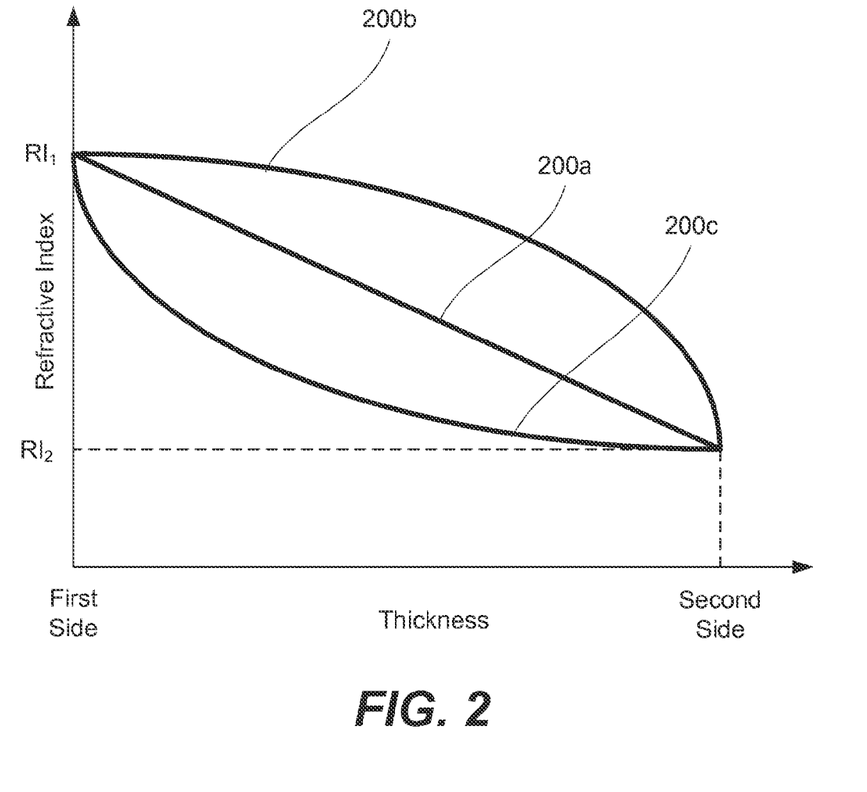
FIG. 2 is a diagram showing a refractive index profile of the TCO layer as a function of its thickness, in accordance with some embodiments.

FIG. 2 is a refractive index profile of a TCO layer as a function of its thickness, in accordance with some embodiments. As shown, the refractive index $RI_1$ at the first side of the TCO layer (e.g., the side facing the substrate and, in some embodiments, interfacing an epitaxial stack) may be greater than the refractive index $RI_2$ at the second side of the TCO layer (e.g., the side facing away from the substrate and, in some embodiments, interfacing the encapsulating layer or air gap). Lines 200a, 200b, and 200c show different refractive index profiles of the TCO layer, all gradually reducing from the first side to the second side. The decrease may be linear as, for example, shown by line 200a. In some embodiments, the decrease may be more rapid initially as, for example, shown by line 200c due to fast reaction rates of the processing gas and rapid depletion of this gas in the processing chamber as further described below with reference to FIG. 5. Alternatively, the decrease may be less initially as, for example, shown by line 200b due to slow reaction rates of the processing gas and slow depletion of this gas in the processing chamber as further described below with reference to FIG. 5.

The refractive index variability may be achieved by feeding a substrate through a deposition chamber having a variable concentration of at least one process gas, such as oxygen, nitrogen, or a combination of oxygen and nitrogen. Specifically, the concentration of the process gas may be higher at one slit opening of the deposition chamber than at another slit opening. For example, a concentration of oxygen may be higher at the incoming slit than at an outgoing slit. As the substrate moves through the deposition chamber, the TCO layer is continuously deposited. Due to the concentration variability, the resulting TCO layer may have a variable composition throughout the thickness of the TCO layer. For example, the composition of the TCO layer on one side may be represented by the formula $InGa_X Zn_Y O_{A1} N_{B1}$, while the composition on the other side may be represented by the formula $InGa_X Zn_Y O_{A2} N_{B2}$ such that $X=1, Y=1, A1=1, B1=1, A2=0.1, B2=1$.

Processing and Apparatus Examples

Figure 3:
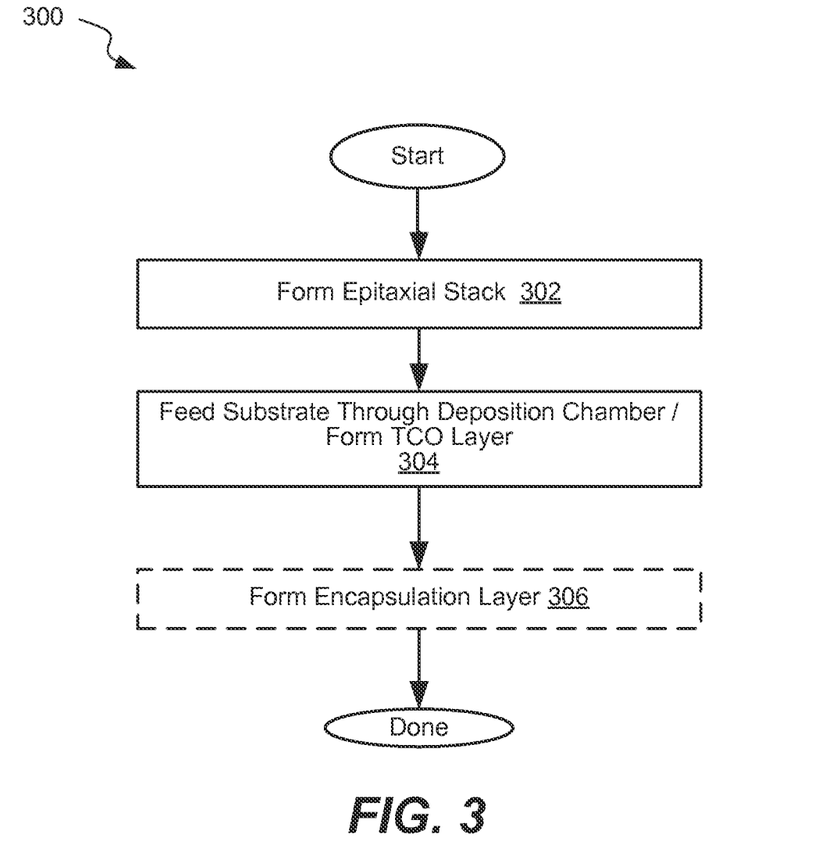
FIG. 3 is a process flowchart of a method for fabricating an LED having a TCO layer with a changing refractive index throughout the thickness of the TCO layer, in accordance with some embodiments.

FIG. 3 is a process flowchart corresponding to method 300 of fabricating an LED having a TCO layer with a variable refractive index, in accordance with some embodiments. Method 300 may commence with forming an epitaxial stack at operation 302 before feeding the substrate through the deposition chamber. In some embodiments, the epitaxial stack includes a p-doped semiconductor layer, active layer, and n-doped semiconductor layer. The p-doped semiconductor layer may include a p-doped gallium nitride or aluminum gallium nitride layer, and the n-doped semiconductor layer may include an n-doped gallium nitride or aluminum gallium nitride layer. The active layer may be or may include a multi-quantum well formed by indium gallium nitride or gallium nitride.

Figure 4:
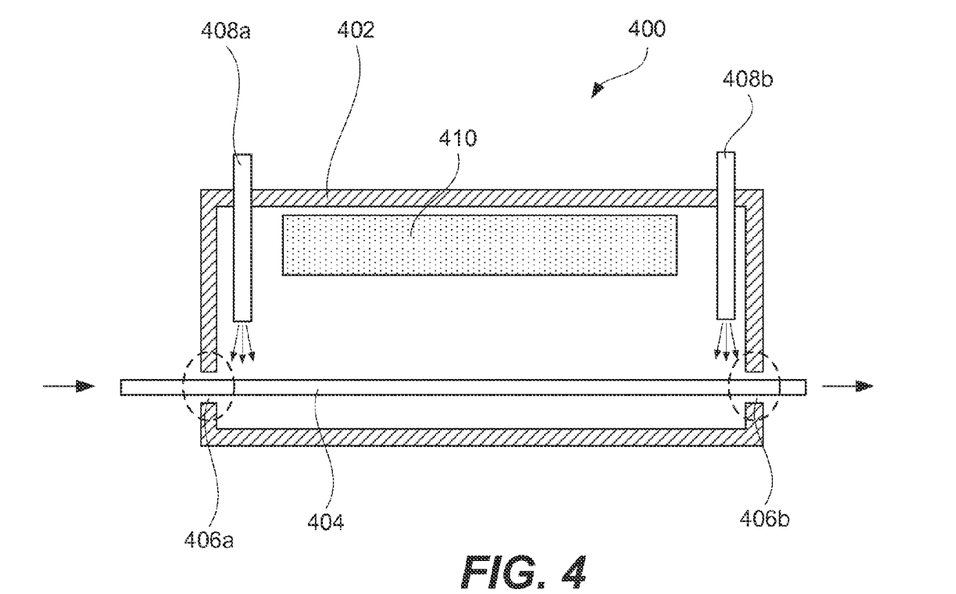
FIG. 4 is a simplified schematic diagram of an apparatus for reactive sputtering deposition of a TCO layer with a changing refractive index throughout the thickness of the TCO layer, in accordance with some embodiments.

Method 300 includes feeding a substrate through a deposition chamber from a first slit opening to a second slit opening during operation 304. One example of a suitable deposition chamber is shown in FIG. 4. Specifically, FIG. 4 is a schematic diagram of apparatus 400 that may be used for reactive sputtering deposition. In some embodiments, apparatus 400 includes deposition chamber 402, which may be a vacuum chamber. Deposition chamber 402 has first slit opening 406a at one side of deposition chamber 402 and second slit opening 406b at another side of deposition chamber 402. Gas line 408a may be disposed near first slit opening 406a. Another gas line 408b may be disposed near second slit opening 406b. Various process gases may be fed through gas line 408a and/or gas line 408b into areas near first slit opening 406a and/or second slit opening 406b, respectively. While gas line 408a and gas line 408b are shown positioned inside of deposition chamber 402, in some embodiments, one or both gas line 408a and gas line 408b may be positioned outside deposition chamber 402 and directed into slit openings 406a and 406b. Furthermore, it should be mentioned that one or more processing gases may be supplied through only one of gas line 408a and gas line 408b. Alternatively, one or more processing gases may be supplied through both gas line 408a and gas line 408b at the same time, but the composition of one or more processing gases supplied through gas line 408a is different than the composition of one or more processing gases supplied through gas line 408b.

Sputtering target 410 is positioned inside deposition chamber 402 between first slit opening 406a and second slit opening 406b. Substrate 404 is moved inside the deposition chamber 402 from first slit opening 406a to second slit opening 406b. Material of sputtering target 410 is removed by bombarding sputtering target 410 with charged species and deposited onto substrate 404. As the sputtered material travels through the environment of deposition chamber 402, these materials may react with the process gases in this environment, e.g., processes gases supplied through gas line 408a and gas line 408b. Because the composition of this environments changes between first slit opening 406a and second slit opening 406b, the composition of the TCO layer also changed as it is being deposited and as substrate 404 is fed through deposition chamber 402.

Sputtering target 410 may include one or more metals of various materials, such as indium tin oxide, indium zinc oxide, indium gallium zinc oxide, cadmium tin oxide, zinc oxide, indium oxide, tin oxide, copper aluminum oxide, aluminum gallium oxide, aluminum strontium oxide, or aluminum zinc oxide. In some embodiments, sputtering target 410 includes only one or more metals, e.g., indium, tin, zinc, gallium, cadmium, copper, aluminum, strontium, and combinations thereof. These metal targets do not include oxygen or nitrogen. Instead, oxygen and/or nitrogen are added to the deposited TCO layer from the environment of deposition chamber 402. Alternatively, sputtering target 410 includes oxygen and/or nitrogen. In this case, additional oxygen and/or nitrogen are still added to the deposited TCO layer from the environment of deposition chamber 402. When a material is dislodged from the sputtering target during reactive sputtering, the material passes through a processing environment containing oxygen and/or nitrogen. However, the concentration of one or more of oxygen and nitrogen varies within the environment of deposition chamber 402 between first slit opening 406a and second slit opening 406b.

Figure 5:
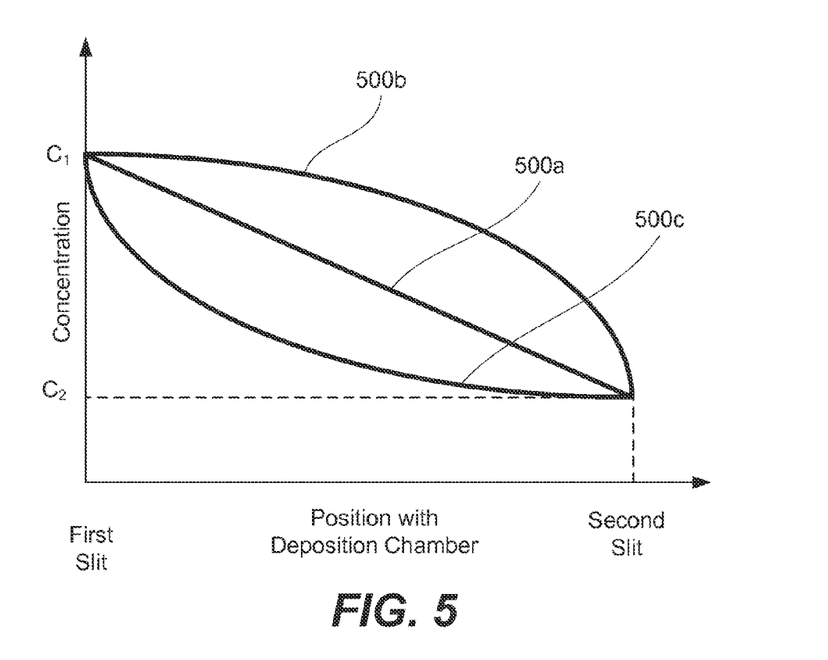
FIG. 5 is a diagram showing a concentration profile of a process gas as a function of the position in a deposition chamber, in accordance with some embodiments.

FIG. 5 is a concentration profile of one or more process gases as a function of the position in a deposition chamber, in accordance with some embodiments. The concentration $C_1$ at the first slit opening of the deposition chamber may be greater than the concentration $C_2$ at the second slit opening. Lines 500a, 500b, and 500c represent different concentration profiles. Specifically, line 500a represents a linear reduction of the process gas concentrations from the first slit opening to the second slit opening. Line 500b represents a less rapid initial drop (than the liner profile represented by line 500a) of the concentration profile, which may be due to low initial consumption of the processing gases or, for example, removal of the process gases at the second slit opening. Line 500c represents a more rapid initial drop (than the liner profile represented by line 500a) of the concentration profile, which may be due to high initial consumption of the processing gases.

Method 300 may proceed with feeding the substrate through the deposition chamber during operation 304. A TCO layer is deposited on the substrate as the substrate is fed through the deposition chamber. For reference and clarity of the description, the feeding direction is from the first slit opening to the second slit opening. During operation 304, the material dislodged from the sputtering target passed through the processing environment containing oxygen and/or nitrogen is deposited on the substrate. Due to concentration of the process gas varying from the first slit opening to the second slit opening of the deposition chamber, the composition of the TCO layer varies throughout a thickness of the TCO layer. For example, an initial deposited portion of the TCO layer has a higher concentration of oxygen and/or nitrogen. This compositional variation results in the refractive index of the TCO layer varying throughout the thickness of the TCO layer.

As shown in FIG. 2, in some embodiments, the refractive index of the TCO layer is greater at the first side of the TCO layer facing the substrate than at the second side of the TCO layer facing away from the substrate. For example, the refractive index of the TCO layer at the first side may be between about 2.1 and 2.3 or, more specifically, between about 2.2 and 2.3. The refractive index of the TCO layer at the second side may be between about 1.5 and 1.8 or, more specifically, between about 1.5 and 1.6. The refractive index of the TCO layer at the second side may depend on another component that interfaces this side. As shown on FIGS. 1A and 1B, the TCO may interface with an encapsulating layer or an air gap. For example, if a silicon dioxide encapsulating layer is used, than the refractive index values listed above can be used. Alternatively, if the second side faces an air gap, then the refractive index of the TCO layer at the second side may be between about 1.0 and 1.3 or, more specifically, between about 1.0 and 1.1.

The variability of the refractive index may be achieved by varying concentration of one or more components in the TCO layer. In some embodiments, the concentration of oxygen varies throughout the thickness of the TCO layer. For example, the concentration of oxygen may be greater at the first side of the TCO layer facing the substrate than at the second side of the TCO layer facing away from the substrate. The concentration of oxygen gradually increases from the first side to the second side of the TCO layer. In some embodiments, the TCO layer has a variable concentration of nitrogen.

The TCO layer may include one of indium tin oxide, indium zinc oxide, indium gallium zinc oxide, cadmium tin oxide, zinc oxide, indium oxide, tin oxide, copper aluminum oxide, aluminum gallium oxide, aluminum strontium oxide, or aluminum zinc oxide. Specifically, the TCO includes indium gallium zinc oxide. Oxygen and/or nitrogen concentrations may be varied in TCO layers including any one of the materials mentioned above.

Method 300 may also include forming another layer over the TCO layer during optional operation 306. One example of such additional layer is an encapsulation layer. The encapsulation layer may include silicon dioxide or some other suitable material. In some embodiments, no other layers are formed over the TCO layer and instead the TCO interfaces an air gap in the overall assembly.

Method 300 may optionally include forming an adhesion layer over the TCO layer and, for example, prior to forming the encapsulation layer. The adhesion layer may include, for example, silver epoxy, conductive polymer, aluminum, gold, platinum, zinc, silver, nickel, and other like materials. In some embodiments, method 300 further optionally includes forming a reflecting layer disposed over the adhesion layer. The reflecting layer may be made, for example, of aluminum, gold, platinum, and other like materials. Optionally, in some embodiments, the method 300 includes forming a contact layer over the reflecting layer.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for fabricating a light emitting diode, the method comprising:
    feeding a substrate and an epitaxial stack of the light emitting diode through a deposition chamber comprising a single sputtering target,
        wherein the epitaxial stack is disposed on the substrate,
        wherein the substrate and the epitaxial stack are fed from a first slit opening at a first edge of the single sputtering target to a second slit opening at a second edge of the single sputtering target,
        wherein a concentration of at least one process gas is higher at the first slit opening than at the second slit opening and varies in an environment between the single sputtering target and the epitaxial stack,
        wherein feeding the substrate and the epitaxial stack comprises forming a transparent conductive oxide layer of the light emitting diode directly on the epitaxial stack as the substrate and the epitaxial stack are fed through the deposition chamber,
        wherein a composition of the transparent conductive oxide layer varies throughout a thickness of the transparent conductive oxide layer, and
        wherein a refractive index of the transparent conductive oxide layer varies throughout the thickness of the transparent conductive oxide layer and matches a refractive index of the epitaxial stack at an interface with the epitaxial stack.

2. The method of claim 1, wherein the refractive index of the transparent conductive oxide layer is greater at a first side of the transparent conductive oxide layer facing the epitaxial stack than at a second side of the transparent conductive oxide layer facing away from the epitaxial stack.

3. The method of claim 2, wherein the refractive index of the transparent conductive oxide layer at the first side is between about 2.1 and 2.3.

4. The method of claim 3, wherein the refractive index of the transparent conductive oxide layer at the second side is between about 1.5 and 1.8.

5. The method of claim 1, wherein a concentration of oxygen varies throughout the thickness of the transparent conductive oxide layer.

6. The method of claim 5, wherein the concentration of oxygen is greater at a first side of the transparent conductive oxide layer facing the epitaxial stack than at a second side of the transparent conductive oxide layer facing away from the epitaxial stack.

7. The method of claim 6, wherein the concentration of oxygen gradually increases or decrease from the first side to the second side of the transparent conductive oxide layer.

8. The method of claim 1, wherein the transparent conductive oxide layer comprises one of indium tin oxide, indium zinc oxide, indium gallium zinc oxide, cadmium tin oxide, zinc oxide, indium oxide, tin oxide, copper aluminum oxide, aluminum gallium oxide, aluminum strontium oxide, or aluminum zinc oxide.

9. The method of claim 1, wherein the transparent conductive oxide layer comprises indium gallium zinc oxide.

10. The method of claim 1, wherein the epitaxial stack comprises a p-doped semiconductor layer, an active layer, and an n-doped semiconductor layer such that the p-doped semiconductor layer directly interfaces the transparent conductive oxide.

11. The method of claim 10, wherein the active layer is a multi-quantum well formed by GaN.

12. The method of claim 1, wherein the at least one process gas is nitrogen.

13. The method of claim 1, wherein the at least one process gas is oxygen.

14. The method of claim 1, wherein the refractive index of the transparent conductive oxide layer varies linearly throughout the thickness of the transparent conductive oxide layer.

15. The method of claim 1, wherein the composition of the transparent conductive oxide layer at the interface with the epitaxial stack is represented by $InGa_1Zn_1O_1N_1$, and wherein the composition of the transparent conductive oxide at a side opposite to the interface with the epitaxial stack is represented by $InGa_1Zn_1O_{0.2}N_1$.

16. The method of claim 1, wherein the substrate comprises at least one of sapphire, silicon carbide, silicon, zinc oxide, magnesium oxide, aluminum nitride, or gallium nitride.

17. The method of claim 1, wherein the epitaxial stack directly interfaces the substrate.

18. The method of claim 1, wherein the single sputtering target consists of one or more metals.

19. The method of claim 1, wherein the concentration of the least one process gas varies linearly between the first slit opening and the second slit opening in the environment between the single sputtering target and the epitaxial stack.

20. The method of claim 1, further comprises forming an encapsulation layer directly on the transparent conductive oxide layer, wherein a refractive index of the transparent conductive oxide layer matches a refractive index of the encapsulation layer at an interface with encapsulation layer.

21. The method of claim 1, wherein the at least one process gas comprises both nitrogen and oxygen.

\* \* \* \* \*